(12) United States Patent
Moens et al.

(10) Patent No.: US 10,964,733 B2
(45) Date of Patent: Mar. 30, 2021

(54) OPTO-ELECTRONIC HEMT

(71) Applicant: SEMICONDUCTOR COMPONENTS INDUSTRIES, LLC, Phoenix, AZ (US)

(72) Inventors: Peter Moens, Erwetegem (BE); Piet Vanmeerbeek, Sleidinge (BE); Abhishek Banerjee, Kruibeke (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 5 days.

(21) Appl. No.: 16/671,366

(22) Filed: Nov. 1, 2019

(65) Prior Publication Data
US 2021/0066355 A1   Mar. 4, 2021

Related U.S. Application Data

(60) Provisional application No. 62/895,807, filed on Sep. 4, 2019.

(51) Int. Cl.
*H01L 29/66* (2006.01)
*H01L 31/11* (2006.01)
(Continued)

(52) U.S. Cl.
CPC ...... *H01L 27/1443* (2013.01); *H01L 21/0254* (2013.01); *H01L 21/02573* (2013.01); *H01L 21/02636* (2013.01); *H01L 21/308* (2013.01); *H01L 21/30612* (2013.01); *H01L 21/765* (2013.01); *H01L 29/122* (2013.01); *H01L 29/2003* (2013.01); *H01L 29/205* (2013.01); *H01L 29/402* (2013.01); *H01L 29/66431* (2013.01); *H01L 29/66462* (2013.01); *H01L 29/778* (2013.01); *H01L 29/7786* (2013.01); *H01L 31/022416* (2013.01); *H01L 31/03044* (2013.01); *H01L 31/11* (2013.01); *H01L 31/1105* (2013.01); *H01L 31/1856* (2013.01)

(58) Field of Classification Search
CPC .... H01L 31/11; H01L 31/1105; H01L 29/122; H01L 29/66431; H01L 29/778
USPC ........................................................ 257/76
See application file for complete search history.

(56) References Cited

U.S. PATENT DOCUMENTS 6,355,945 B1    3/2002  Kadota et al.
10,186,514 B1 * 1/2019  Tao ..................... H01L 29/0847
(Continued)

OTHER PUBLICATIONS

Jean-Luc Polleux, et al., "Optimization of InP—InGaAs HPT Gain: Design of an Opto-Microwave Monolithic Amplifier," IEEE Transactions on Microwave Theory and Techiques, vol. 52, No. 3, Mar. 2004.

(Continued)

*Primary Examiner* — David Vu
*Assistant Examiner* — Brandon C Fox
(74) *Attorney, Agent, or Firm* — Brake Hughes Bellermann LLP (57) ABSTRACT

An opto-electronic High Electron Mobility Transistor (HEMT) may include a current channel including a two-dimensional electron gas (2DEG). The opto-electronic HEMT may further include a photoelectric bipolar transistor embedded within at least one of a source and a drain of the HEMT, the photoelectric bipolar transistor being in series with the current channel of the HEMT.

20 Claims, 11 Drawing Sheets

(51) Int. Cl.

| | |
|---|---|
| *H01L 29/778* | (2006.01) |
| *H01L 27/144* | (2006.01) |
| *H01L 31/18* | (2006.01) |
| *H01L 29/205* | (2006.01) |
| *H01L 29/40* | (2006.01) |
| *H01L 31/0304* | (2006.01) |
| *H01L 31/0224* | (2006.01) |
| *H01L 21/02* | (2006.01) |
| *H01L 21/306* | (2006.01) |
| *H01L 21/308* | (2006.01) |
| *H01L 21/765* | (2006.01) |
| *H01L 29/20* | (2006.01) |
| *H01L 29/12* | (2006.01) |

(56) References Cited

U.S. PATENT DOCUMENTS

| | | | |
|---|---|---|---|
| 2003/0183114 A1 | 10/2003 | Widener | |
| 2012/0061730 A1* | 3/2012 | Yamanaka | H01L 31/1852 |
| | | | 257/197 |
| 2013/0043483 A1* | 2/2013 | Chan | H01L 21/8258 |
| | | | 257/76 |
| 2014/0191249 A1* | 7/2014 | Blanchard | H01L 33/32 |
| | | | 257/77 |
| 2015/0054036 A1* | 2/2015 | Yang | H01L 23/642 |
| | | | 257/195 |

OTHER PUBLICATIONS

Wei Yang et al., "High gain GaN/AlGaN heterojunction phototransistor," Applied Physics Letters 73, 978 (1998).
Masaya Okada et al., "High sensitivity UV phototransistor with GaN/AlGaN/GaN gate epi-structure," phys. stat. sol. (a) 204, No. 6, 2117-2120 (2007).
Toyosaka Moriizumi et al., "Theoretical Analysis of Heterojunction Phototransistors," IEEE Transactions of Electronic Devices, vol. ed-19, No. 2, Feb. 1972.
Naresh Chand, et al., "Gain of a Heterojunction Bipolar Phototransistor," IEEE Translations on Electron Devices, vol. ed-32, No. 3, Mar. 1985.
PerkinElmer Optoelectronics, "Phototransistors," 2008.
Ankit Kumar Pandey et al., "Comprehensive Analysis and Optimal Design of Ge/GeSn/Ge p-n-p Infrared Heterojunction Phototransistors," Journal of the Electron Devices Society, received Oct. 17, 2018; revised Nov. 22, 2018; accepted Nov. 28, 2018; date of publication Nov. 30, 2019; date of current version Mar. 1, 2019.
Cheng-Huang Kuo et al., "Nitride-Based Blue Light-Emitting Diodes Grown with InN/GaN Matrix Quantum Wells," IEEE Journal of Quantum Electronics, vol. 50, No. 4, Apr. 2014.
Alireza Mojab et al., "Introducing Optical Cascode GaN HEMT," IEEE Transactions on Electron Devices, vol. 64, No. 3, Mar. 2017.
Chandrika Sharma et al., "A Review of BJT Based Phototransistor," International Journal of Engineering Research & Technology (IJERT), ISSN: 2278-0181, vol. 3 issue 4, Apr. 2014.

* cited by examiner

OPTO-ELECTRONIC HEMT

CROSS-REFERENCE TO RELATED APPLICATIONS

This application claims the benefit of U.S. Provisional Patent Application No. 62/895,807, filed on Sep. 4, 2019, the entire contents of which is incorporated herein by reference.

TECHNICAL FIELD

This description relates to High Electron Mobility Transistors (HEMTs).

BACKGROUND

A HEMT is a type of transistor that utilizes a current channel formed using a heterojunction at a boundary between two materials having different band gaps. For example, a relatively wide band gap material such as AlGaN (Aluminum Gallium Nitride) may or may not be doped with n-type impurities and used to form a junction with an undoped, lower band gap material, such as GaN (Gallium Nitride). Then, an equilibrium is reached in which the narrower band gap material has excess majority carriers that form a 2-dimensional electron gas (2DEG). Consequently, and because the narrow band gap material has no doping impurities to disrupt current flow through scattering, HEMT devices provide, among other advantages, very high switching speeds, low resistance, high gains, high blocking voltage, and high power applications.

SUMMARY

According to one general aspect, a semiconductor device includes a High Electron Mobility Transistor (HEMT). The HEMT has a current channel including a two-dimensional electron gas (2DEG), and a photoelectric bipolar transistor embedded within at least one of a source and a drain of the HEMT, the photoelectric bipolar transistor being in series with the current channel of the HEMT.

According to another general aspect, a High Electron Mobility Transistor (HEMT) device includes a channel layer, and a barrier layer adjacent to the channel layer and forming a heterojunction therewith, the heterojunction causing a two-dimensional electron gas (2DEG) to occur within the channel layer. The HEMT further includes a source and a drain formed at opposing ends of the 2DEG to define a current channel between the source and the drain, and a photoelectric bipolar transistor formed in at least one of the source and the drain and in series with the current channel.

According to another general aspect, a method of making a High Electron Mobility Transistor (HEMT) includes forming a layer stack that includes at least a channel layer and a barrier layer adjacent to the channel layer and forming a heterojunction at which a current channel is defined in the channel layer. The method further includes masking and etching a source growth region and a drain growth region in the layer stack, and performing selective regrowth in the source growth region and the drain growth region to thereby form a source region and a drain region of the HEMT that are both in electrical contact with the current channel, the selective regrowth including regrowth and doping of at least three layers of alternating dopant type, wherein at least one of the at least three layers is a photoelectric layer.

The details of one or more implementations are set forth in the accompanying drawings and the description below.

Other features will be apparent from the description and drawings, and from the claims.

DETAILED DESCRIPTION

As described in detail below, embodiments include an opto-electronic HEMT with an embedded bipolar transistor within at least one of a source and a drain of the HEMT, and in series with a current channel of the HEMT. The embedded bipolar transistor(s) is a photoelectric device that turns on in response to incident light with a specific wavelength, but is otherwise in an off state (that is, normally-off). As a result, the embedded bipolar transistor(s) enable the opto-electronic HEMT to function as a normally-off device, without requiring a traditional gate structure. Instead, the embedded bipolar transistor provides a gating function in response to incident light.

In general, due to the presence of the 2DEG referenced above, it is straightforward to form a 'normally-on' HEMT. However, particularly for high power applications, a 'normally-off' HEMT may be desired, and a number of modifications to the HEMT structure described above have been developed to enable normally-off HEMT devices. In general, normally-off HEMTs may have an improved safety profile in high power applications, and may simplify related drive circuitry.

In a normally-off HEMT, a gate structure may be used to activate the HEMT. However, introduction of such gate structures is generally associated with a corresponding introduction of a gate capacitance/inductance. Since HEMT devices exhibit very fast switching speeds, such a gate capacitance/inductance is likely to lead to undesired over/under voltage peaks.

In described implementations, however, as the incident light (e.g., laser) may be switched at very high speeds, the opto-electronic HEMT may be operated at very high switching speeds. When there is no traditional, separate gate structure with associated gate contacts, as described and illustrated herein, then the possibility of undesired gate capacitance/inductance is removed, as well. Further, the opto-electronic HEMT may be operated safely and reliably at very high voltages. Additionally, the opto-electronic HEMT of the various embodiments described herein may be manufactured easily and inexpensively.

Figure 1:
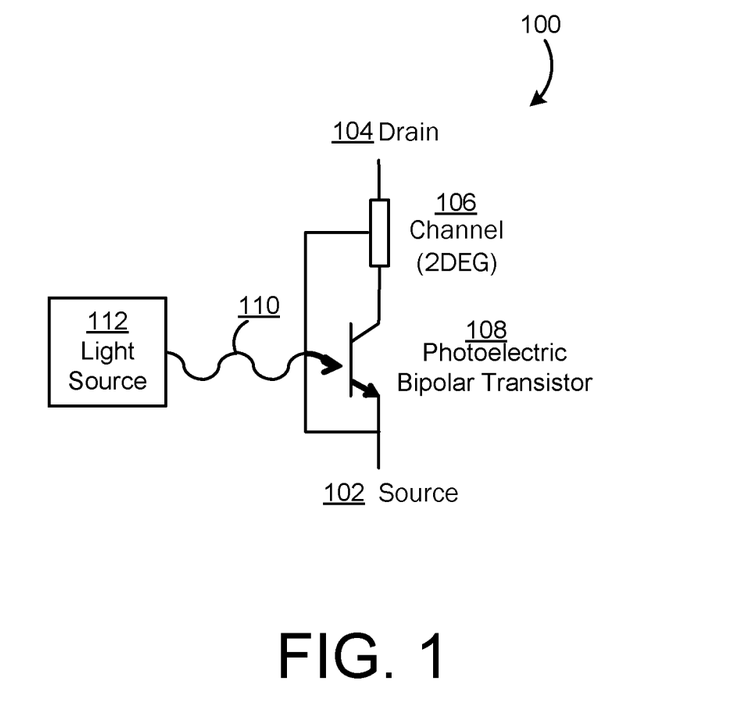
FIG. 1 is a circuit diagram of an opto-electronic HEMT with an embedded bipolar transistor, according to some example implementations.

FIG. 1 is a circuit diagram of an opto-electronic HEMT 100 with an embedded bipolar transistor, according to some example implementations. In the example of FIG. 1, the opto-electronic HEMT 100 includes a source 102 and a drain 104. A channel region 106 of the opto-electronic HEMT 100 is formed using at least one 2DEG region of high electron mobility.

Further in FIG. 1, a photoelectric bipolar transistor 108 is illustrated as being connected in series with the channel 106. As referenced above and described in detail, below, the photoelectric bipolar transistor 108 may be a normally-off device that prevents current flow through the channel 106 unless the photoelectric bipolar transistor 108 is activated. Accordingly, when light 110 is received from a light source 112 at a base of the photoelectric bipolar transistor 108, current flow is activated between an emitter and collector of the photoelectric bipolar transistor 108, and through a base thereof, so that a source-drain current is allowed to flow through the channel 106, as well.

In some configurations, the light source 112 may be a low power laser capable of switching speeds on the order of femtoseconds or faster. In general, the light source 112 may be tuned to match corresponding material properties of the HEMT 100 as described herein, but for the sake of example, some implementations may use a light source with optical power output in the range of tens of milliwatts, e.g., 70-90 mW. For example, when the photoelectric bipolar transistor 108 has a gain in a range of 100-1500, the above ranges of optical power may be sufficient to provide the HEMT with a current rating of, e.g., 10 A or more.

Figure 2:
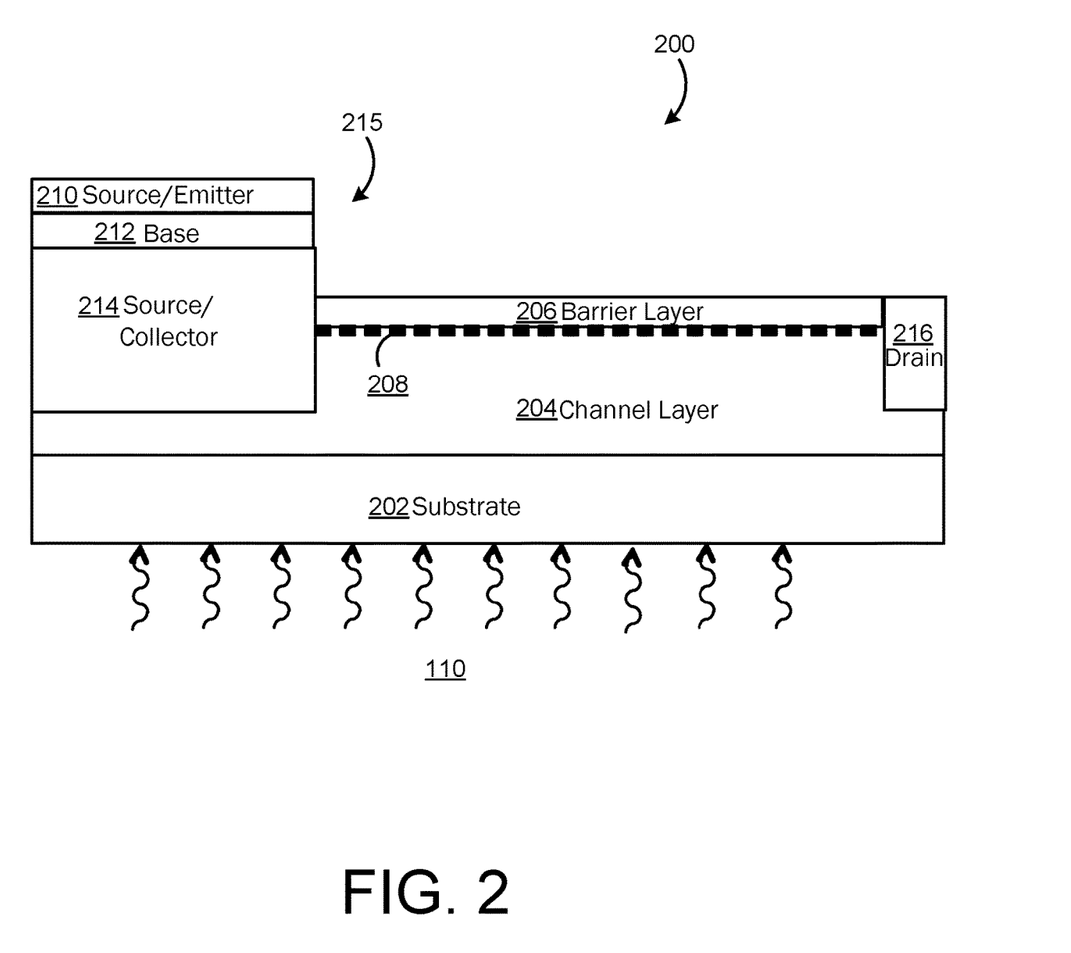
FIG. 2 illustrates an example device structure of the opto-electronic HEMT with an embedded bipolar transistor of FIG. 1.

FIG. 2 illustrates an example device structure 200 of the opto-electronic HEMT with an embedded bipolar transistor 100 of FIG. 1. In the example of FIG. 2, a substrate 202 is illustrated as having a channel layer 204 formed in contact therewith, with a barrier layer 206 forming a heterojunction with the channel layer 204. As referenced above, the heterojunction occurring at the interface of the channel layer 204 and the barrier layer 206 causes a channel region 208 that includes a 2DEG region of high electron mobility. For example, the channel layer 204 may be an undoped material with a relatively large width and relatively narrow bandgap energy, while the barrier layer 206 may be a doped or an undoped material with a relatively thin width and a relatively wide bandgap energy.

Further in FIG. 2, a source/emitter region 210 is formed in contact with a base layer 212, which itself is in contact with a source/collector layer 214. Thus, as described herein, the device 200 of FIG. 2 effectively includes a region 215 having a HEMT source with a photoelectric bipolar transistor embedded therein. Consequently, in conjunction with the operational principles described above with respect to FIG. 1, incident light 110 enables current flow between the region 215 and a drain 216, using the channel 208.

FIG. 2 is a simplified example illustrating possible structural characteristics of implementations of the opto-electronic HEMT 100 of FIG. 1. In various embodiments, the example structure of FIG. 2 may be implemented using various available materials suitable for each layer thereof, by removing or including various additional or alternative layers or regions, by modifying electrical characteristics of any of the various layers in desired manners, or by otherwise implementing the device 200 in a manner(s) consistent with the operational characteristics described herein. Therefore, although some such variations in implementation are described herein with respect to FIGS. 3-9, may other embodiments are possible.

For example, in FIG. 2, light 110 is illustrated as being incident upon the substrate 202. As may be appreciated from the example of FIG. 1, the light 110 is designed to activate the base 212. Accordingly, in FIG. 2, the substrate 202, as well as the channel layer 204 and the source/collector region 214, may all be formed so as to be transparent to the light 110, so that the light 110 may reach and activate the base 212.

Put another way, in example implementations, the base region 212 may be constructed to have a bandgap energy $E_g$ that is lower than a bandgap of any material in the device 200 that is positioned between the base region 212 and the light 110. In the example of FIG. 2, the light traverses the substrate 202, the channel layer 204, and the source/collector region 214, as described and illustrated. However, in other implementations, other intervening layers or regions may be included, and may be traversed by the light 110, as well.

Figure 3:
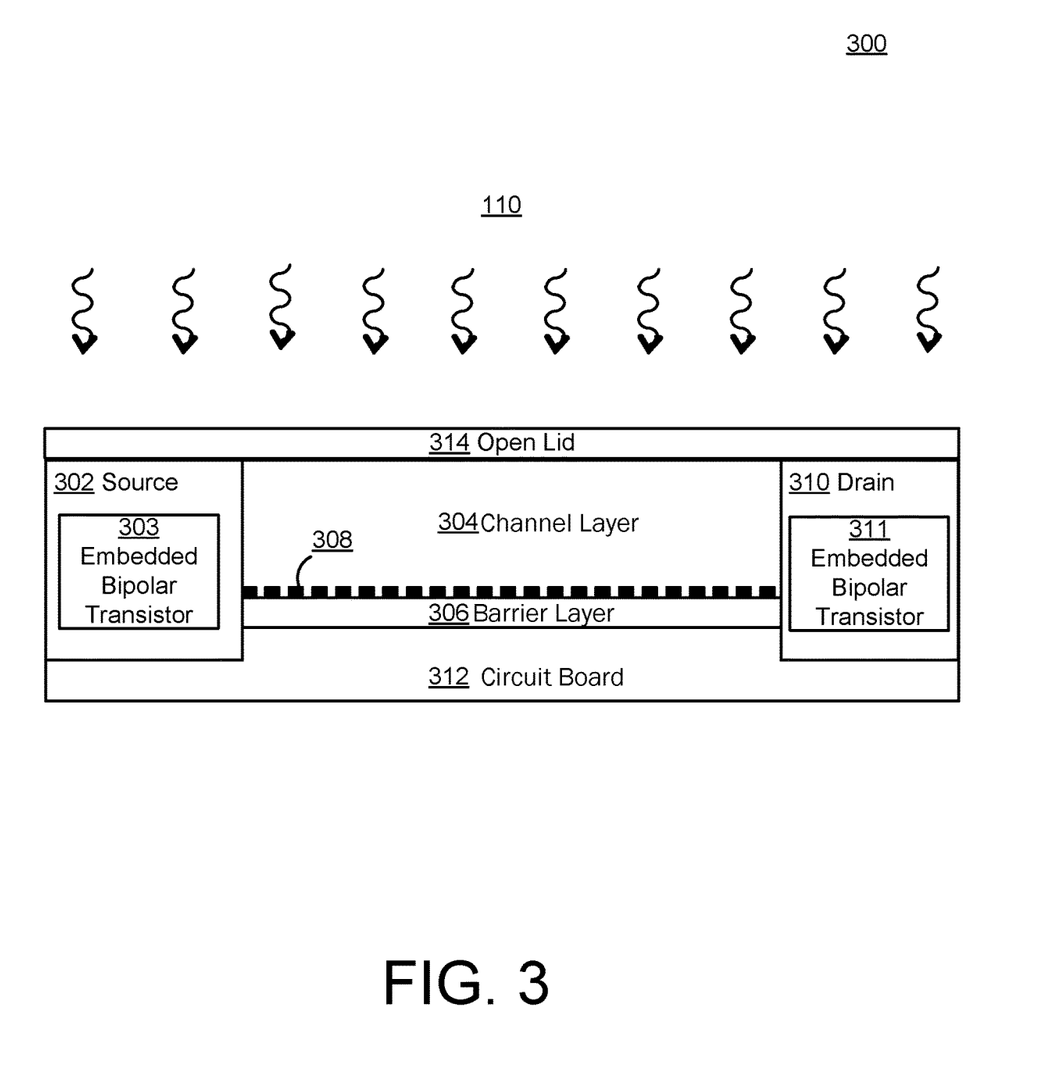
FIG. 3 illustrates an example flip chip device structure of the opto-electronic HEMT with an embedded bipolar transistor of FIG. 1.

In other implementations, as illustrated in FIG. 3, the substrate 202 may be omitted. In other implementations, the light 110 may be incident from a different angle than that shown in FIG. 2. When it is not possible, feasible, or preferred to construct intervening layers that are transparent to the light 110, then implementations may enable the light 110 to reach the base region 212 by partially removing or omitting portions of layers/regions that would otherwise block the light 110 (e.g., by making the layers/regions smaller, or by including holes or other structures that enable the light 110 to reach the base region 212).

For example, the light 110 may be incident upon the base region 212 from a direction perpendicular to that shown in FIG. 2, e.g., from a left side of FIG. 2. In still other examples, the light 110 may be incident upon the device 200 in a direction opposite to that shown in FIG. 2 (e.g., from a top of the device 200, as illustrated in FIG. 2). In some example scenarios, as referenced, the source/emitter region 210 may be constructed to cover the base region 212 only partially, in order to allow the light 110 to reach the base region 212.

FIG. 3 illustrates an example flip chip device structure 300 of the opto-electronic HEMT with an embedded bipolar transistor of FIG. 1. In general, the term flip chip refers to any known or future techniques in which an initial construction of a device in a first orientation is followed by flipping or otherwise inverting or rotating the constructed device for attachment to a separate support structure in a second orientation (e.g., upside down). In many cases, the initial construction is implemented using an initial support structure that is removed in conjunction with transitioning to a final desired support structure. For example, a structure formed with a substrate as a bottom layer may be flipped and attached to a circuit board, whereupon the substrate may be removed.

In the example of FIG. 3, a source 302 is illustrated as having a photoelectric bipolar transistor 303 embedded therein, as illustrated and described above with respect to FIG. 2. Also consistent with FIG. 2, a channel layer 304 is illustrated as forming a heterojunction interface with a barrier layer 306, thereby forming 2DEG region 308.

In the example of FIG. 3, as referenced above, a drain 310 is illustrated as also including an embedded bipolar transistor 311. Thus, the device structure 300 illustrates that the example implementations of FIGS. 1 and 2 may be implemented using an embedded bipolar transistor in either or both (e.g., at least one) of the source and drain of a HEMT.

As FIG. 3 represents a flip chip embodiment, a circuit board 312 is illustrated as providing physical support for the source 302, drain 310, and barrier layer 306. Of course, FIG. 3 is a simplified example, and the circuit board 312 represents any suitable type of physical support structure capable of also providing desired electrical connections with the device elements of FIG. 3, as well as with various other circuit elements (e.g., driver circuitry) that may be desired to operate in conjunction with the example of FIG. 3. As an example, the circuit board 312 may be the lead frame of the device package.

Consistent with the example of FIG. 2, and with the description provided above in conjunction with FIG. 3, the substrate 202 of FIG. 2 may be used during device formation and subsequent flipping of the resulting device. Then, the substrate 202 may be removed following attachment to the circuit board 312. In such scenarios, the substrate 202 need not be transparent to light 110, since the substrate is ultimately removed prior to device use.

Instead, packaging with an open lid 314 may be used, in order to allow light 110 to enter active device region(s). Accordingly, lid openings may be defined in the open lid 314 in any manner suitable for matching an underlying device structure.

Figure 4:
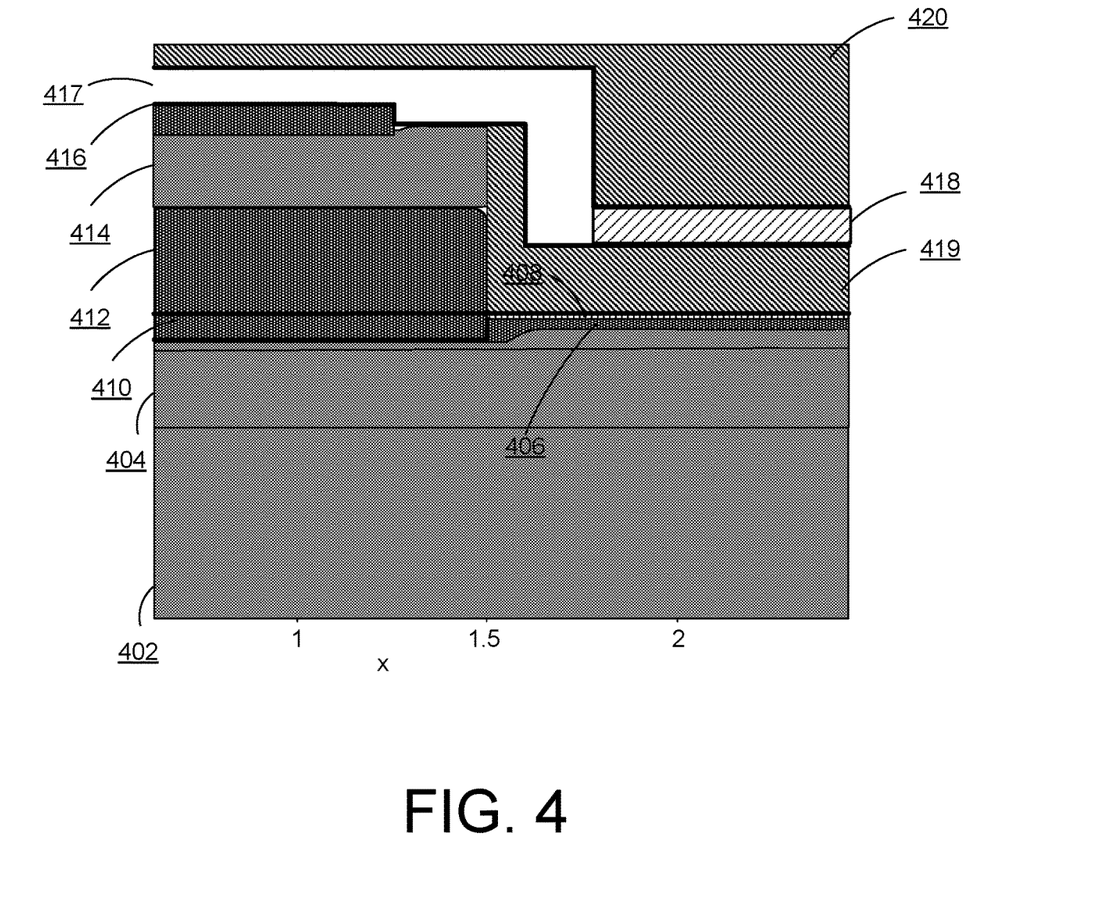
FIG. 4 is a more detailed example device structure of the opto-electronic HEMT with an embedded bipolar transistor of FIG. 1.

FIG. 4 is a more detailed example device structure of the opto-electronic HEMT with an embedded bipolar transistor 100 of FIG. 1. In the example of FIG. 4, various example materials, dopant levels, and parameter value ranges are provided for the sake of example and illustration. Other implementations may differ in these and other aspects.

In FIG. 4, a carbon-doped Gallium Nitride (GaN) buffer layer 402 is illustrated that may be advantageous in scenarios in which the device of FIG. 4 is used in high voltage contexts. For example, by doping the GaN buffer layer 402 with Carbon or other suitable p-type material, the n-type nature of GaN is effectively counter-doped, so that the layer 402 is more insulating and able to sustain high Voltage.

A GaN channel layer 404 includes a 2DEG layer 406 at the heterojunction with an AlGaN barrier layer 408. Further in FIG. 4, a layer 410 of heavily doped, n++ material is formed adjacent to an n-drift layer 412. A p-doped base layer 414 is formed between the n-drift layer 412 and a n++ doped source layer 416 that is in electrical contact with a source contact 417, which overlays the n++ layer 416, the p-base layer 414, and a surface passivation layer 419, and which is electrically connected to a source field plate 418, as described below. A dielectric layer 420 extends over the source contact 417 and the source field plate 418. Thus, in the example, the layers form a source region corresponding to, for example, source region 302 of FIG. 3, so that the layers 416/414/412/410 form a NPN bipolar transistor embedded therein and corresponding to the embedded bipolar transistor 303 of FIG. 3.

In order to take advantage of the various photoelectric properties described herein with respect to the p-base layer 414, the p-base layer may be formed using any suitable, direct bandgap material, e.g., a III-V material such as GaN or Indium Nitride (InN), or combinations thereof. For example, InGaN may be used with desired doping ranges of In being used to define the bandgap of the p-base layer 414. In this way, for example, as referenced herein, the bandgap of the p-base layer 414 may be adjusted to ensure that the bandgap of the p-base layer 414 is lower than a bandgap of any layer of the structure that intervenes between the p-base layer 414 and the light source being used for switching. In this way, as described, electron-hole pairs may be generated within the p-base layer 414 in response to the light source. As also referenced, such electron-hole generation in the p-base layer 414 effectively creates a base current, which amplifies the photo-current by a factor of a hundred, a thousand, or more.

In the example of FIG. 4, the p-base layer 414 is illustrated as being electrically connected to the source/emitter region 416, by the source contact layer 417. In other implementations, however (e.g., the implementation of FIG. 10), the p-base layer may be unconnected and left electrically floating.

Further in FIG. 4, as referenced above, the source field plate (FP) 418 is illustrated as being in electrical contact with the source contact 417, and extending over the passivation layer 419 and the barrier layer 408. With reference to the circuit diagram of FIG. 1, the source FP 418 may be understood to represent a capacitor in parallel with the 2DEG channel 106, i.e., connected between the drain 104 and a collector of the bipolar transistor 108.

Thus, when the drain 104 experiences a very high voltage during an off state, the bipolar transistor 108 (e.g., 410/412/414/416 in FIG. 4) is shielded from experiencing this high voltage. Otherwise, without such protection, the base region 414 may be subject to punchthrough. As a result, the bipolar transistor 108 may be implemented as a low voltage device, even when the HEMT as a whole is a high voltage device.

Put another way, the field plate 418 overlays the passivation layer 419 and the barrier layer 408, and together these elements form a capacitor between the source metal 417 and the 2DEG 406. This parasitic capacitor will deplete the 2DEG when a high enough voltage is applied across it, e.g., about 50V for a 600V rated device.

For example, even at drain voltages of 500-600V or more at a HEMT drain, a bipolar collector region(s) 410, 412 may be maintained at less than (i.e., pinched off at), e.g., 50V. Desired voltage ranges may be set by configuring, e.g., a thickness of the surface passivation layer 419, or a length/extension of the field plate 418 over the surface passivation layer 419. For example, for a given thickness and for the example voltage ranges of 500-600V, an extension of the field plate 420 may be in a range of 0.5 to 5 microns in order to achieve pinch off of 50V.

Put another way, the source field plate 418 will deplete the 2DEG channel 406 when a drain potential of a HEMT drain (not shown in FIG. 4) goes to a high voltage. When the HEMT of FIG. 4 switches off and the HEMT drain goes to a high voltage, then the capacitance between the field plate 418 and the 2DEG 406 will deplete. The charge in the 2DEG layer 406 will be depleted and the HEMT transistor will be maintained in an off state. In the off state, an electric field across the n-generation layer(s) 410, 412 will sweep out the excess carriers from the base region 414 once the trigger laser is turned off.

As referenced above, in described implementations the p-base layer 414 has the lowest bandgap $E_g$ of any material disposed between the p-base layer 414 and the light source during operation. Thus, for example, when intervening layers include GaN and Si, the p-base layer 414 may be formed using InN, with a bandgap of, for example, $E_g$=0.77 eV, which is smaller than the next-smallest bandgap of 1.1 eV for Si). Alternatively, for GaN and SiC, the p-base layer 414 may be InGaN, with, e.g., 10% Ga to obtain a bandgap $E_g$=3.17 eV, which is less than the, e.g., 3.3 eV bandgap for SiC). In other implementations, an intervening AlGaN layer may have its bandgap Eg effectively elevated through doping with Al. For example, 25% Al doping would result in a bandgap of Eg=4.14 eV.

Figure 5:
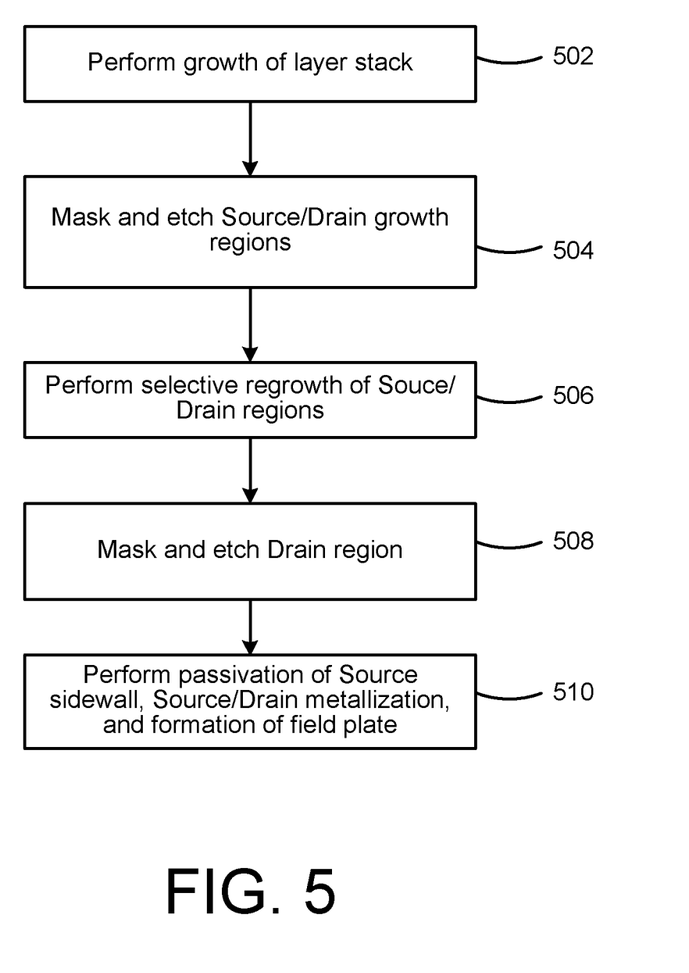
FIG. 5 is a flowchart illustrating an example process for forming an implementation of the opto-electronic HEMT of FIG. 1.

FIG. 5 is a flowchart illustrating an example process for forming an implementation of the opto-electronic HEMT of FIG. 1. Individual operations 502-510 of FIG. 5 are illustrated in corresponding, respective FIGS. 6-10.

Figure 6:
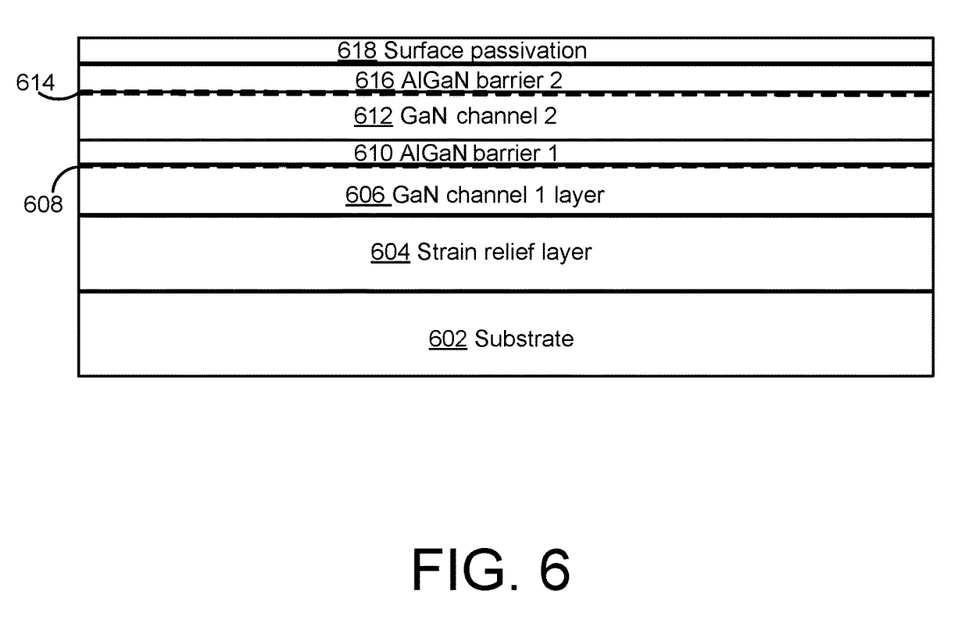
FIG. 6 illustrates a first example intermediate device structure corresponding to the example process of FIG. 5.

In FIG. 5, an initial growth of a layer stack is performed (502), e.g., a Metal Organic Chemical Vapor Deposition (MOCVD) process or other suitable process. An example result of operation 502 is illustrated in FIG. 6, in which a layer stack is illustrated as having been formed and including a substrate 602, which may be, e.g., GaN, Si, Silicon Carbide (SiC), Aluminum Nitride (AlN), or Sapphire. A strain relief layer 604 may be included in a subsequent layer, if needed to facilitate strain relief with respect to any lattice mismatch that may occur between the substrate 602 and a first channel layer 606.

For example, in FIG. 6, the channel layer 606 is illustrated as being formed using GaN, which has a non-trivial lattice mismatch with a substrate 602 formed of Si. The resulting strain at the junction may be relieved, for example, by including GaN doped with a percentage of Al within the strain relief layer 604.

A first 2DEG 608 may thus be formed at a heterojunction between the first GaN channel layer 606 and a first AlGaN barrier layer 610. Similarly, a second GaN channel layer 612 formed on the first AlGaN barrier layer 610 may define a second 2DEG 614 at a heterojunction formed with a second AlGaN barrier layer 616.

Finally in FIG. 6, a surface passivation layer 618 is illustrated. The surface passivation layer 618 may be used, for example, to render a surface of the second AlGaN barrier layer 616 inert. In various implementations, different materials than those shown 602, 604, 606, 610, 612, 616, and 618 may be used.

In FIG. 6, as illustrated and described further with respect to FIGS. 7-10, the two 2DEG channels 608 and 614 form parallel channels and corresponding current paths. Also, having multiple such channels may serve to decouple a drift resistance of the multiple 2DEG channels from a base current of an embedded bipolar transistor to be formed within a source/drain of a HEMT, as described herein.

Figure 7:
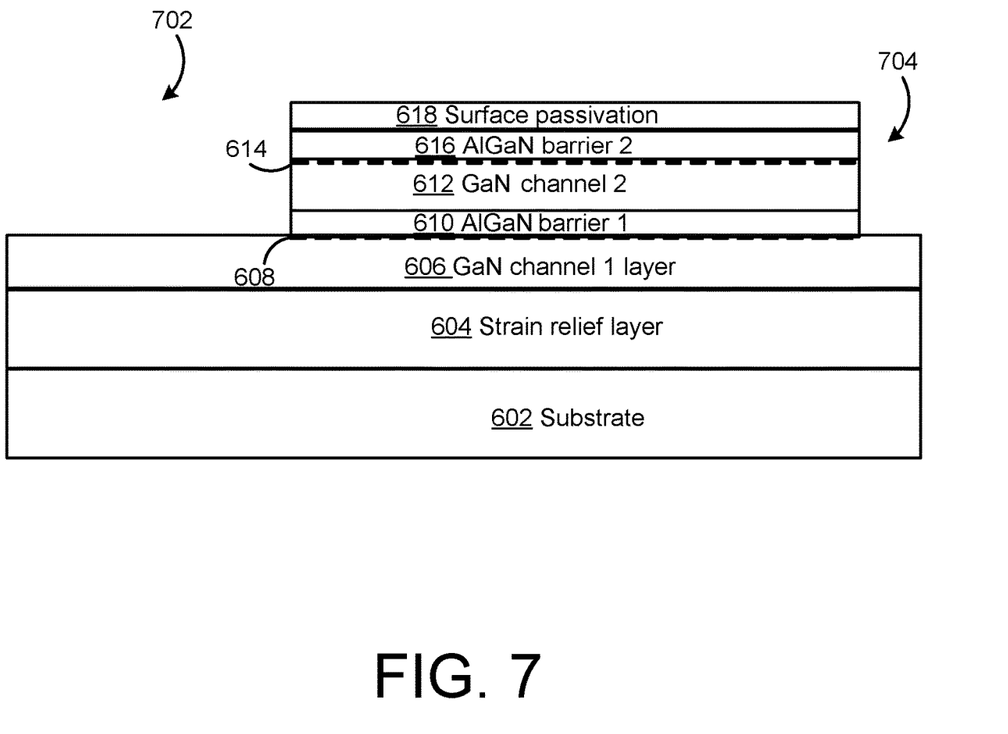
FIG. 7 illustrates a second example intermediate device structure corresponding to the example process of FIG. 5.
Figure 8:
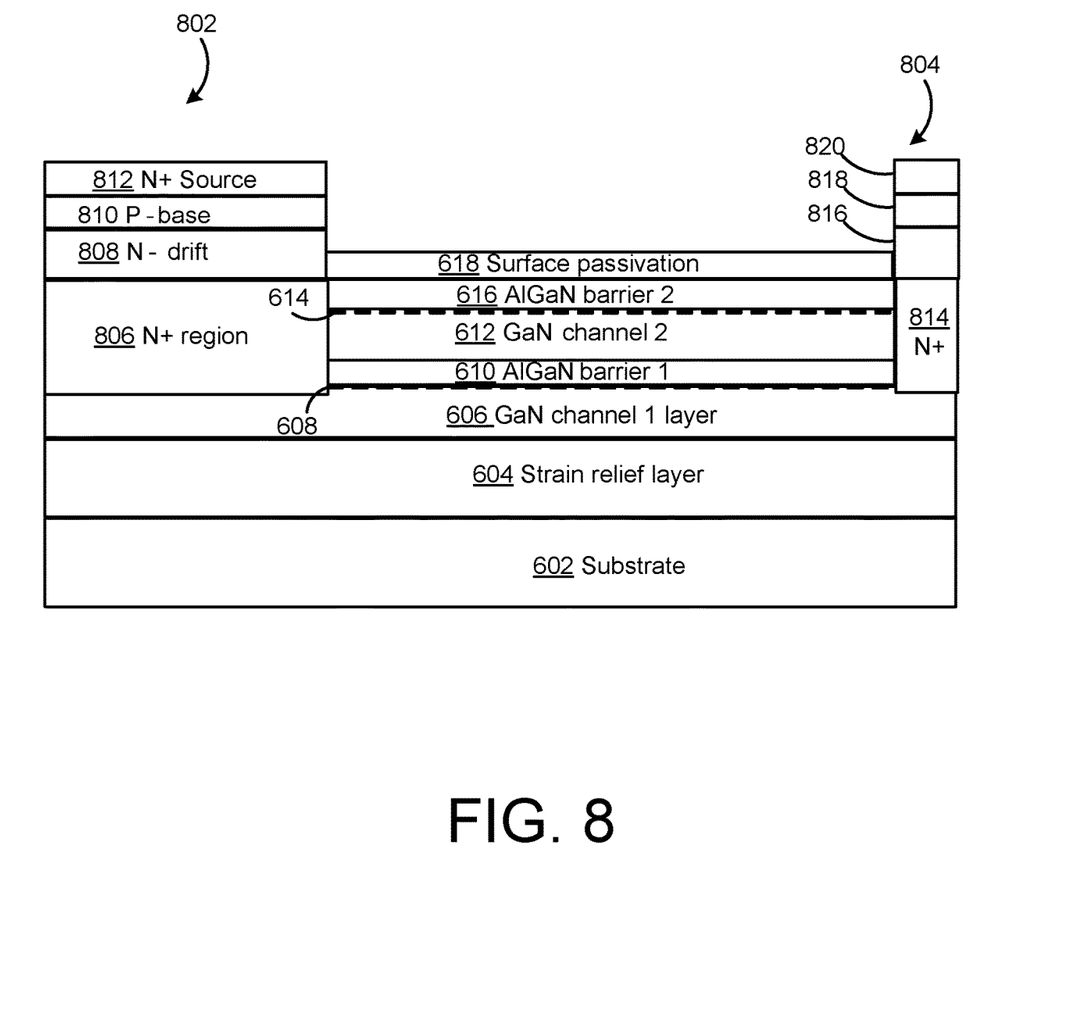
FIG. 8 illustrates a third example intermediate device structure corresponding to the example process of FIG. 5.
Figure 9:
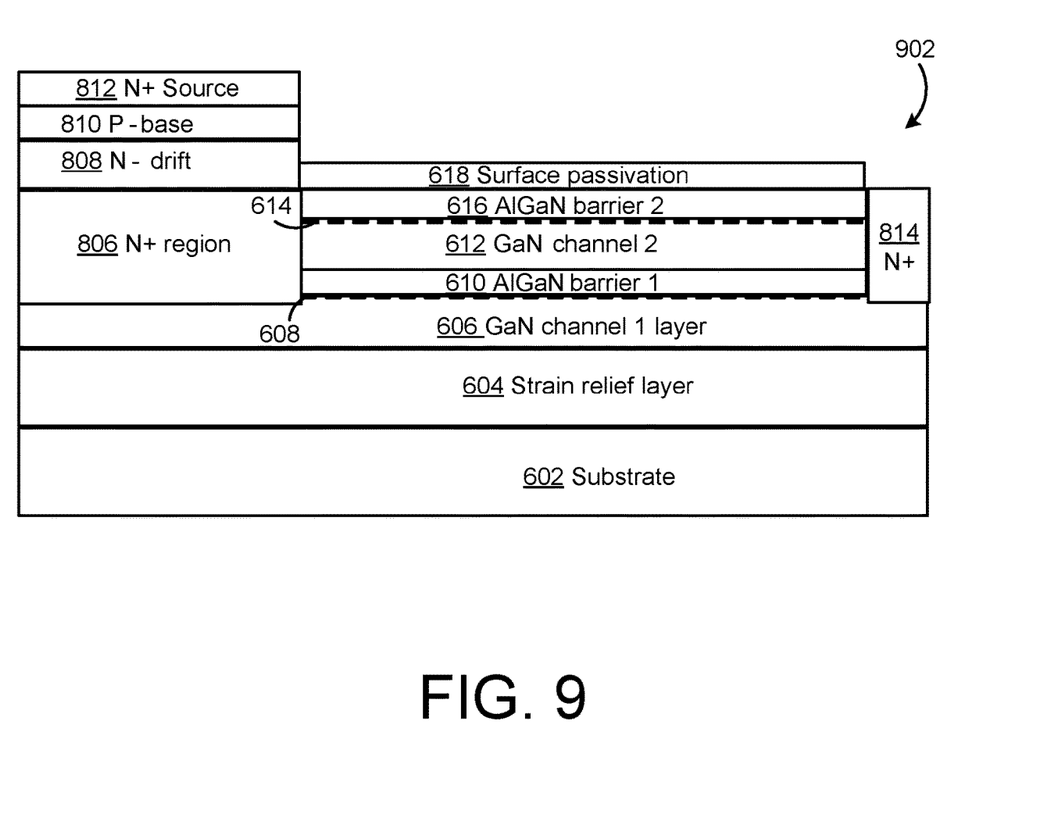
FIG. 9 illustrates a fourth example intermediate device structure corresponding to the example process of FIG. 5.
Figure 10:
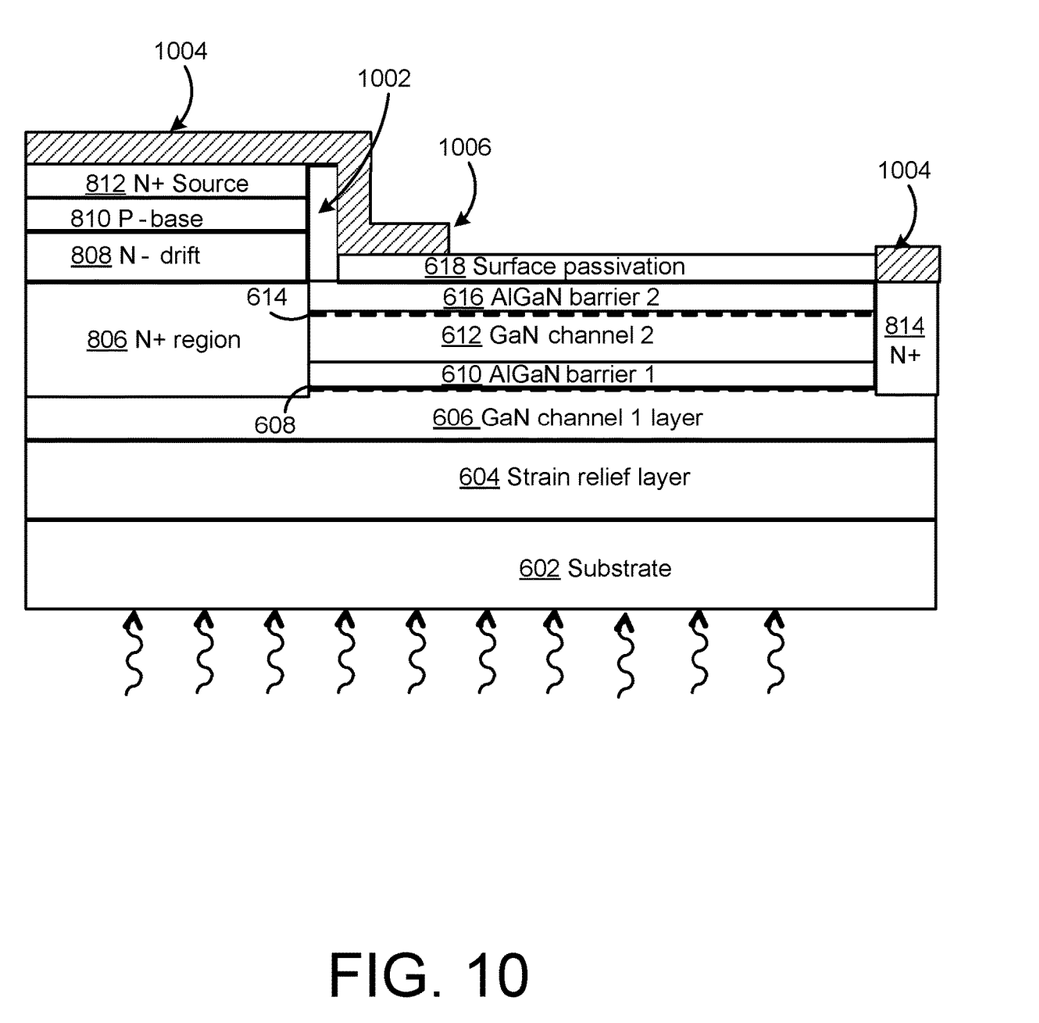
FIG. 10 illustrates a fifth example device structure corresponding to the example process of FIG. 5.

Further in FIG. 5, source/drain growth regions may be masked and etched (504). As shown in FIG. 7, such masking and etching results in formation of opening 702 in which a source region may be formed, as well as an opening 704 in which a drain region may be formed. As illustrated in FIGS. 8-10, such source/drain regions may include the types of embedded bipolar transistors described herein.

Then, selective regrowth of source and drain regions may proceed (506). For example, as shown in FIG. 8, source region 802 and drain region 804 may be regrown. Specifically, for source region 802, an n+ region 806 may be grown, followed by n-drift region 808. The p-base layer 810 may be added, followed by the n+ region 812 serving as the source/emitter. As the layers 806/808/818/812 are grown, corresponding layers 814, 816, 818, 820 will also be deposited on the drain side of the device, thereby including at least a drain region 814.

Masking and etching may again be performed (508), this time to etch and remove the drain-side layers 816, 818, 820. A resulting structure is shown in FIG. 9, with area 902 indicating the location of the etched materials.

In other implementations, however, and as referenced above with respect to the example of FIG. 3 and the illustrated drain-side embedded bipolar transistor 311, it is also possible to retain the layers 816, 818, 820, for use in forming such a drain-side embedded bipolar transistor. As also described with respect to FIG. 3, such a drain-side bipolar transistor may be implemented in addition to, or instead of, the source-side embedded bipolar transistor, e.g., 303 of FIG. 3.

Finally in FIG. 5, passivation of a source sidewall, as well as metallization of the source and drain regions and formation of a source field plate may proceed (510). As shown in FIG. 10, the result may include vertical passivation surface 1002 and source/drain metallization 1004. Further, in FIG. 10, a source field plate 1006 may be formed that extends horizontally along the surface passivation layer 618, as described above.

Figure 11:
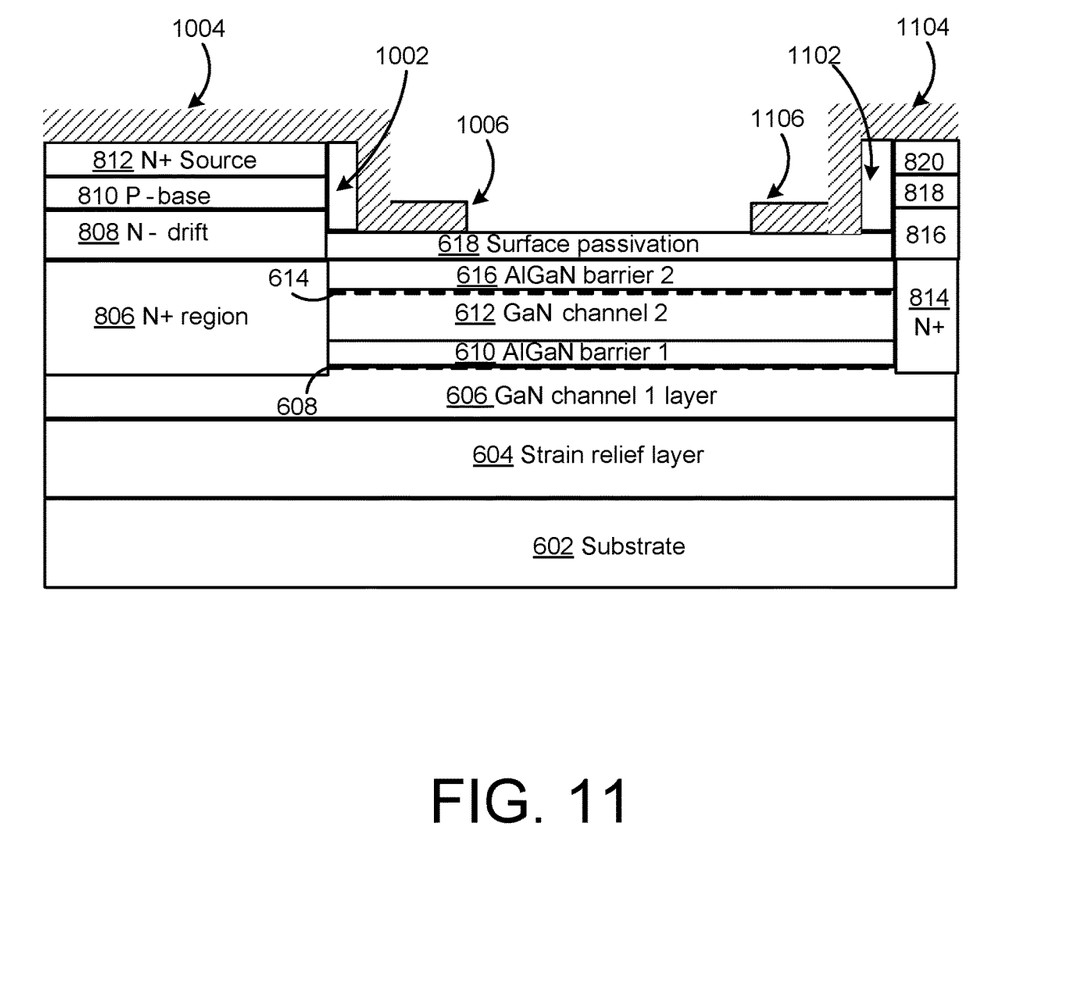
FIG. 11 illustrates an alternate example device structure corresponding to the example of FIG. 10.

FIG. 11 illustrates an alternative embodiment, in which the layers 816, 818, 820 of FIG. 8 are not etched, and instead are retained and subjected to the same doping on a drain side as corresponding layers 808, 810, 812 on the source side. Then, as also shown in FIG. 11, drain-side surface passivation layer 1102, metal contact 1104, and field plate 1106 may be added in conjunction with corresponding source side elements, i.e., the surface passivation layer 1002, metal contact 1004, and drain field plate 1006. Thus, FIG. 11 corresponds to an example implementation of the embodiment 300 of FIG. 3.

In the various embodiments, suitable doping levels may be selected for desired uses and applications of corresponding HEMT devices. For the sake of example, doping layers disclosed herein as being n+ or N+ (e.g., 410, 416, 806, 812, 814, 820) may be in a range of about $1 \times 10^{18}$-$1 \times 10^{21}$ cm$^{-3}$, with a corresponding thickness of, e.g., 10-500 nm. Doping layers disclosed herein as being p or P (e.g., 414, 810, 818) may be in a range of about $1 \times 10^{16}$-$1 \times 10^{19}$ cm$^{-3}$, with a corresponding thickness of, e.g., 20-1000 nm. Doping layers disclosed herein as being n- or $n_{drift}$ (e.g., 412, 808, 816) may be in a range of about $1 \times 10^{15}$-$1 \times 10^{18}$ cm$^{-3}$, with a corresponding thickness of, e.g., 50-2000 nm.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device, comprising:
  a High Electron Mobility Transistor (HEMT) having:
    a current channel including a two-dimensional electron gas (2DEG); and
    a photoelectric bipolar transistor embedded within at least one of a source and a drain of the HEMT, the photoelectric bipolar transistor being in series with the current channel of the HEMT.

2. The semiconductor device of claim 1, wherein the photoelectric bipolar transistor is normally-off, and maintains the HEMT in a normally-off state until activated by incident light, and further wherein the HEMT is turned on and a current flow through the current channel of the HEMT is enabled in response to the incident light.

3. The semiconductor device of claim 1, wherein the photoelectric bipolar transistor is configured to turn on in response to laser light received from at least one laser, and further wherein the HEMT is switched on and off in response to pulses of the laser light.

4. The semiconductor device of claim 1, further comprising at least a second current channel of the HEMT provided by at least a second 2DEG, wherein the photoelectric bipolar transistor is in series with a parallel combination of the 2DEG and at least the second 2DEG.

5. The semiconductor device of claim 1, wherein the source and the drain of the HEMT are formed using a first dopant type, and at least one of the source and the drain comprise:
  a first region having a first dopant type and forming a first part of at least one of the source and the drain, and forming an emitter of the photoelectric bipolar transistor;
  a second region having a second dopant type and formed of a photoelectric material, and forming a base of the photoelectric bipolar transistor; and
  a third region having the first dopant type and forming a second part of at least one of the source and the drain, and forming a collector of the photoelectric bipolar transistor.

6. The semiconductor device of claim 5, wherein the second region is electrically floating.

7. The semiconductor device of claim 1, wherein the photoelectric bipolar transistor includes an emitter, a base, and a collector, the base being formed using a photoelectric material having a bandgap energy that is less than a bandgap energy of any intervening material of the HEMT positioned between the base and an incident light used to activate the photoelectric bipolar transistor.

8. The semiconductor device of claim 1, wherein the HEMT is flip-chip mounted.

9. The semiconductor device of claim 1, further comprising:
  a field plate formed in parallel with the current channel, and configured to provide a parallel capacitance shielding the photoelectric bipolar transistor from HEMT voltages in excess of a punchthrough voltage of the photoelectric bipolar transistor.

10. A High Electron Mobility Transistor (HEMT) device, comprising:
  a channel layer;
  a barrier layer adjacent to the channel layer and forming a heterojunction therewith, the heterojunction causing a two-dimensional electron gas (2DEG) to occur within the channel layer;
  a source and a drain formed at opposing ends of the 2DEG to define a current channel between the source and the drain; and
  a photoelectric bipolar transistor formed in at least one of the source and the drain and in series with the current channel.

11. The HEMT of claim 10 wherein the source and the drain are formed using a first dopant type, and at least one of the source and the drain comprise:
  a first region having a first dopant type and forming a first part of at least one of the source and the drain, and forming an emitter of the photoelectric bipolar transistor;
  a second region having a second dopant type and formed of a photoelectric material, and forming a base of the photoelectric bipolar transistor; and
  a third region having the first dopant type and forming a second part of at least one of the source and the drain, and forming a collector of the photoelectric bipolar transistor.

12. The HEMT of claim 10, wherein the photoelectric bipolar transistor is normally-off, and maintains the HEMT in a normally-off state until activated by incident light, and further wherein the HEMT is turned on and a current flow through the current channel of the HEMT is enabled in response to the incident light.

13. The HEMT of claim 10, wherein the photoelectric bipolar transistor is configured to turn on in response to laser light received from at least one laser, and further wherein the HEMT is switched on and off in response to pulses of the laser light.

14. The HEMT of claim 10, wherein the photoelectric bipolar transistor includes an emitter, a base, and a collector, the base being formed using a photoelectric material having a bandgap energy that is less than a bandgap energy of any intervening material of the HEMT positioned between the base and an incident light used to activate the photoelectric bipolar transistor.

15. The HEMT of claim 14, wherein photoelectric bipolar transistor is embedded within the source, and the base is electrically connected to a source contact of the source.

16. The HEMT of claim 10, further comprising:
  a passivation layer formed in contact with the barrier layer;
  a contact layer formed in contact with the passivation layer; and
  a field plate formed in contact with the contact layer and configured to provide a capacitance in parallel with the current channel and shielding the photoelectric bipolar transistor from HEMT voltages in excess of a punch-through voltage of the photoelectric bipolar transistor.

17. A method of making a High Electron Mobility Transistor (HEMT), comprising:
   forming a layer stack that includes at least a channel layer and a barrier layer adjacent to the channel layer and forming a heterojunction at which a current channel is defined in the channel layer;
   masking and etching a source growth region and a drain growth region in the layer stack; and
   performing selective regrowth in the source growth region and the drain growth region to thereby form a source region and a drain region of the HEMT that are both in electrical contact with the current channel, the selective regrowth including regrowth and doping of at least three layers of alternating dopant type, wherein at least one of the at least three layers is a photoelectric layer.

18. The method of claim 17, further comprising:
   masking and etching one of the source region and the drain region to remove at least two of the at least three layers therefrom.

19. The method of claim 17, wherein the photoelectric layer has a bandgap energy that is less than a bandgap energy of any intervening layer of the HEMT disposed between the photoelectric layer and an incident light source.

20. The method of claim 17, further comprising forming a field plate layer in parallel with the current channel.

\* \* \* \* \*